United States Patent
Chen et al.

(10) Patent No.: US 11,201,722 B1
(45) Date of Patent: Dec. 14, 2021

(54) CLOCK AND DATA RECOVERY CIRCUIT

(71) Applicant: DigWise Technology Corporation, LTD, Hsinchu County (TW)

(72) Inventors: Shih-Hao Chen, Hsinchu County (TW); Chiou-Bang Chen, Hsinchu County (TW); Wen-Pin Hsieh, Hsinchu County (TW); Tai-Cheng Lee, Taipei (TW); Heng-Jui Liu, Taoyuan (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 17/115,813

(22) Filed: Dec. 9, 2020

(30) Foreign Application Priority Data

Aug. 28, 2020 (TW) ................................ 109129564

(51) Int. Cl.
 *H03D 3/24* (2006.01)
 *H04L 7/033* (2006.01)
 *H03L 7/099* (2006.01)
 *H03L 7/087* (2006.01)
 *H03L 7/08* (2006.01)

(52) U.S. Cl.
 CPC ............ *H04L 7/033* (2013.01); *H03L 7/0807* (2013.01); *H03L 7/087* (2013.01); *H03L 7/099* (2013.01)

(58) Field of Classification Search
 CPC ....... H04L 7/033; H04L 7/0334; H03L 7/099; H03L 7/087; H03L 7/0807; H03K 3/03
 USPC .......................... 375/327, 326, 355, 373–376
 See application file for complete search history.

(56) References Cited

U.S. PATENT DOCUMENTS

| | | | |
|---|---|---|---|
| 5,740,213 A * | 4/1998 | Dreyer | ..................... H03K 3/03 375/374 |
| 7,016,613 B2 | 3/2006 | Savoj | |
| 7,170,964 B2 | 1/2007 | Kocaman et al. | |
| 7,330,058 B2 | 2/2008 | Lin | |
| 7,737,743 B1 | 6/2010 | Gao et al. | |
| 7,826,583 B2 | 11/2010 | Jeong et al. | |
| 8,279,992 B1 | 10/2012 | Li | |
| 10,367,634 B1 | 7/2019 | Yu | |
| 10,425,092 B2 | 9/2019 | Shu et al. | |
| 2018/0302214 A1* | 10/2018 | Terlemez | .............. H04L 7/0334 |

FOREIGN PATENT DOCUMENTS

| | | |
|---|---|---|
| CN | 103427830 B | 2/2016 |
| TW | I535213 B | 5/2016 |
| TW | I637601 B | 10/2018 |
| TW | I681634 B | 1/2020 |

* cited by examiner

*Primary Examiner* — Phuong Phu

(74) *Attorney, Agent, or Firm* — CKC & Partners Co., LLC

(57) ABSTRACT

A clock and data recovery circuit includes a first sampling phase detector and filter circuitry, a frequency detector circuit, a current source circuit, a band controller circuit, and a voltage controlled oscillator. The first sampling phase detector and filter circuitry generates a first voltage according to a pair of data and a first set of clock signals. The frequency detector circuit generates an up control signal and a down control signal according to the pair of data and the first set of clock signals. The current source circuit generates the first voltage according to the up control signal and the down control signal. The band controller circuit generates a band control signal according to the first voltage. The voltage controlled oscillator adjusts the first set of clock signals according to the band control signal and the first voltage.

10 Claims, 3 Drawing Sheets

CLOCK AND DATA RECOVERY CIRCUIT

RELATED APPLICATIONS

This application claims priority to Taiwanese Application Serial Number 109129564, filed Aug. 28, 2020, which is herein incorporated by reference.

BACKGROUND

Technical Field

The present disclosure relates to clock and data recovery technology. More particularly, the present disclosure relates to a clock and data recovery circuit which has a simpler circuit structure.

Description of Related Art

With developments of communication technology, operation speeds of communication systems become faster and faster. Due to some factors, noise or jitter may be introduced in data during the data transmission. For ensuring that a receiver device can receive data accurately, a clock and data recovery circuit is often disposed in the receiver device.

However, circuit structures of the clock and data recovery circuits in some related approaches are more complex.

SUMMARY

Some aspects of the present disclosure are to provide a clock and data recovery circuit. The clock and data recovery circuit includes a first sampling phase detector and filter circuitry, a frequency detector circuit, a current source circuit, a band controller circuit, and a voltage controlled oscillator. The first sampling phase detector and filter circuitry is configured to generate a first voltage according to a pair of data and a first set of clock signals. The frequency detector circuit is configured to generate an up control signal and a down control signal according to the pair of data and the first set of clock signals. The current source circuit is configured to generate the first voltage according to the up control signal and the down control signal. The band controller circuit is configured to generate a band control signal according to the first voltage. The voltage controlled oscillator is configured to adjust the first set of clock signals according to the band control signal and the first voltage.

As described above, in the clock and data recovery circuit of the present disclosure, there is no need to dispose a charge pump between the sampling phase detector circuit and the filter circuit. Accordingly, the structure of the clock and data recovery circuit of the present disclosure is simpler.

BRIEF DESCRIPTION OF THE DRAWINGS

The disclosure can be more fully understood by reading the following detailed description of the embodiment, with reference made to the accompanying drawings as follows.

DETAILED DESCRIPTION

The embodiments in the following descriptions are described in detail with the accompanying drawings, but the examples provided are not intended to limit the scope of the disclosure covered by the present disclosure. The structure and operation are not intended to limit the execution order. Any structure regrouped by elements, which has an equal effect, is covered by the scope of the present disclosure. In addition, the drawings are merely for illustration and are not illustrated according original sizes. For ease of understanding, the same or similar components in the following descriptions will be described with the same symbols.

In the present disclosure, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "circuitry" may indicate a system formed with one or more circuits. The term "circuit" may indicate an object, which is formed with one or more transistors and/or one or more active/passive elements based on a specific arrangement, for processing signals.

In the present disclosure, "connected" or "coupled" may refer to "electrically connected" or "electrically coupled." "Connected" or "coupled" may also refer to operations or actions between two or more elements.

Figure 1:
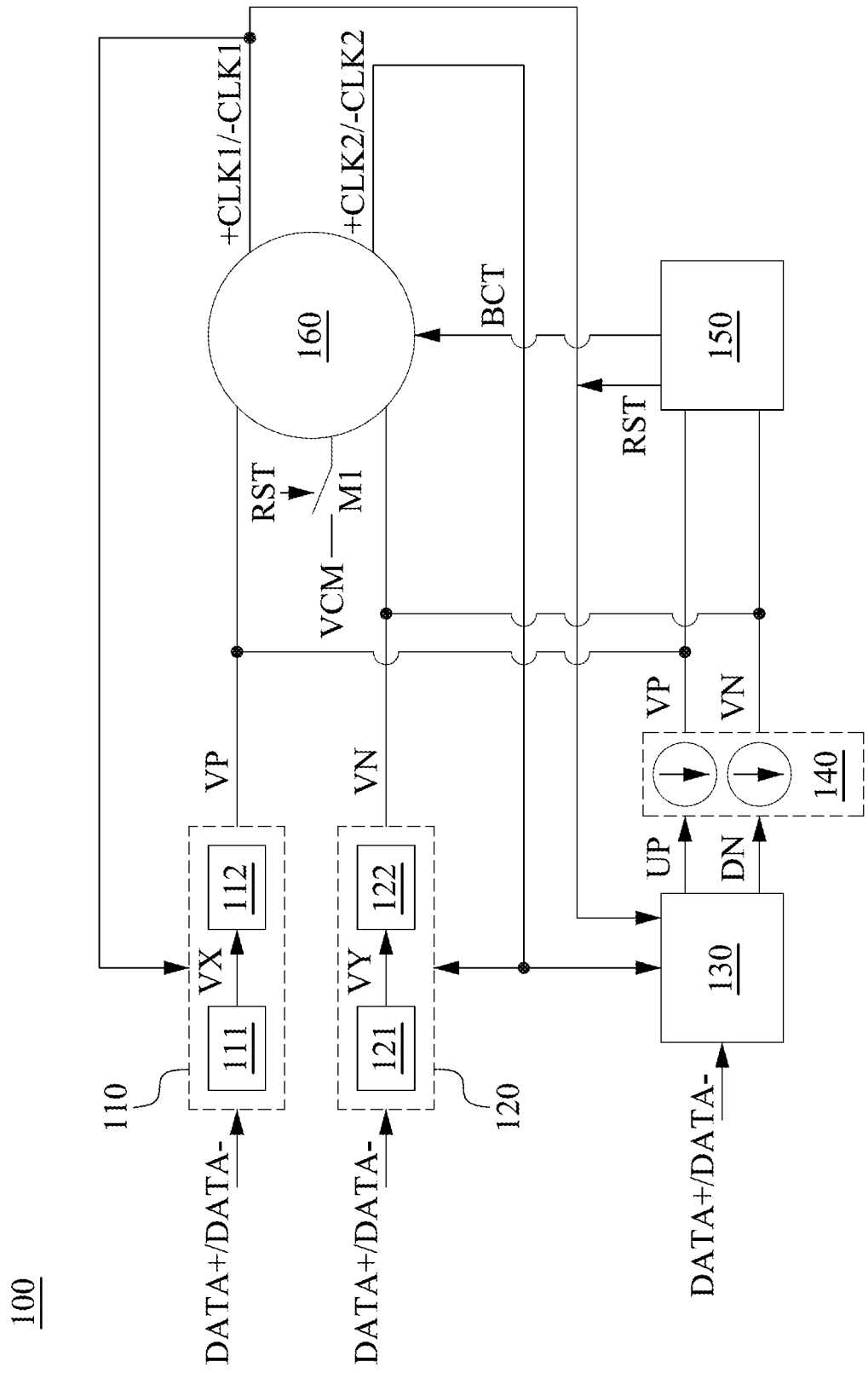
FIG. 1 is a schematic diagram of a clock and data recovery circuit according to some embodiments of the present disclosure.

Reference is made to FIG. 1. FIG. 1 is a schematic diagram of a clock and data recovery circuit 100 according to some embodiments of the present disclosure. In some embodiments, a communication system includes a transmitter device and a receiver device, and the clock and data recovery circuit 100 is disposed in the receiver device. With the clock and data recovery circuit 100, the receiver device still can receive the data from the transmitter device accurately event though noise or jitter is introduced in the data during the transmission.

As illustrated in FIG. 1, the clock and data recovery circuit 100 includes a sampling phase detector and filter circuitry 110, a sampling phase detector and filter circuitry 120, a frequency detector circuit 130, a current source circuit 140, a band controller circuit 150, and a voltage controlled oscillator (VCO) 160.

The sampling phase detector and filter circuitry 110 includes a sampling phase detector circuit 111 and a filter circuit 112. The sampling phase detector circuit 111 is configured to receive a pair of data DATA+ and DATA− and a first set of clock signals +CLK1 and −CLK1. The sampling phase detector circuit 111 generates a detection signal VX according to the pair of data DATA+ and DATA− and the first set of clock signals +CLK1 and −CLK1. The filter circuit 112 is directly coupled to the sampling phase detector circuit 111, to generate a first voltage VP according to the detection signal VX.

The sampling phase detector and filter circuitry 120 includes a sampling phase detector circuit 121 and a filter circuit 122. The sampling phase detector circuit 121 is configured to receive the pair of data DATA+ and DATA− and a second set of clock signals +CLK2 and −CLK2. The sampling phase detector circuit 121 generates a detection signal VY according to the pair of data DATA+ and DATA− and the second set of clock signals +CLK2 and −CLK2. The filter circuit 122 is directly coupled to the sampling phase detector circuit 121, to generate a second voltage VN according to the detection signal VY.

The frequency detector circuit 130 is coupled to the voltage controlled oscillator 160 and configured to receive the pair of data DATA+ and DATA−, the first set of clock signals +CLK1 and −CLK1, and the second set of clock signals +CLK2 and −CLK2, to generate an up control signal UP and a down control signal DN according to these signals. In some embodiments, the frequency detector circuit 130 is implemented by a full-rate frequency detector.

The current source circuit 140 is coupled to the frequency detector circuit 130 and configured to receive the up control signal UP and the down control signal DN, to generate the first voltage VP and the second voltage VN according to the up control signal UP and the down control signal DN.

The band controller circuit 150 is coupled to the current source circuit 140 and configured to receive the first voltage VP and the second voltage VN, to generate a band control signal BCT and a reset signal RST according to the first voltage VP and the second voltage VN.

The voltage controlled oscillator 160 is directly coupled to the filter circuit 112, the filter circuit 122, and the band controller circuit 150. The voltage controlled oscillator 160 is configured to receive the first voltage VP, the second voltage VN, and the band control signal BCT, to adjust the first set of clock signals +CLK1 and −CLK1 and the second set of clock signals +CLK2 and −CLK2 according to the first voltage VP, the second voltage VN, and the band control signal BCT. The purpose of adjusting the band control signal BCT is for adjusting the band of the voltage controlled oscillator 160. For example, when the first voltage VP is greater than a first threshold value, the band control signal BCT can be configure to adjust the band of the voltage controlled oscillator 160 up by one step. When the second voltage VN is less than a second threshold value (the second threshold value is less than the first threshold value), the band control signal BCT can be configured to adjust the band of the voltage controlled oscillator 160 down by one step.

Accordingly, the clock and data recovery circuit 100 samples the pair of data DATA+ and DATA− according to the adjusted first set of clock signals +CLK1 and −CLK1 and the adjusted second set of clock signals +CLK2 and −CLK2, to ensure that the clock and data recovery circuit 100 can receive the data accurately. For example, the clock and data recovery circuit 100 may further include a flip-flop, and the flip-flop samples the data DATA+ according to the adjusted clock signal +CLK1, to acquire correct received data.

In some embodiments, the voltage controlled oscillator 160 is further coupled to a switch M1. The switch M1 is configured to receive a reset voltage VCM, and the switch M1 is controlled to be turned on or off by the reset signal RST. For example, when the switch M1 is controlled to be turned on by the reset signal RST, the switch M1 transmits the reset voltage VCM to the voltage controlled oscillator 160, such that the voltage controlled oscillator 160 is reset to an initial value according to the reset voltage VCM.

Regarding the operations above, main functions of the frequency detector circuit 130, the current source circuit 140, and the band controller circuit 150 are for coarse tuning and frequency lock. Main functions of the sampling phase detector and filter circuitry 110, the sampling phase detector and filter circuitry 120, and the voltage controlled oscillator 160 are for fine tuning and phase lock.

In the other hand, as illustrated in FIG. 1, the clock and data recovery circuit 100 includes two the sampling phase detector and filter circuitries 110 and 120. The quantity of the sampling phase detector and filter circuitries in FIG. 1 is only for illustration. Various suitable quantities are within the contemplated scopes of the present disclosure. For example, in some other embodiments, the clock and data recovery circuit 100 only includes one sampling phase detector and filter circuitry (for example, only includes one sampling phase detector and filter circuitry 110), or includes more than two sampling phase detector and filter circuitries.

In some related approaches, a charge pump is disposed between the sampling phase detector circuit and the filter circuit. In these related approaches, the circuit structure is more complex and a larger layout space is required.

Compared to the related approaches above, in the clock and data recovery circuit 100 of the present disclosure, there is no charge pump between the sampling phase detector circuit 111 and the filter circuit 112. Similarly, there is no charge pump between the sampling phase detector circuit 121 and the filter circuit 122. Accordingly, the circuit structure of the present disclosure can be simpler and it can reduce the layout space.

In addition, in some related approaches, the clock and data recovery circuit is transformed from a voltage domain to a current domain first, and then transformed from the current domain back to the voltage domain.

Compared to the related approaches above, the clock and data recovery circuit 100 of the present disclosure is without being transformed from the voltage domain to the current domain. Accordingly, the circuit structure of the present disclosure can be simpler and it can reduce the layout space.

Figure 2:
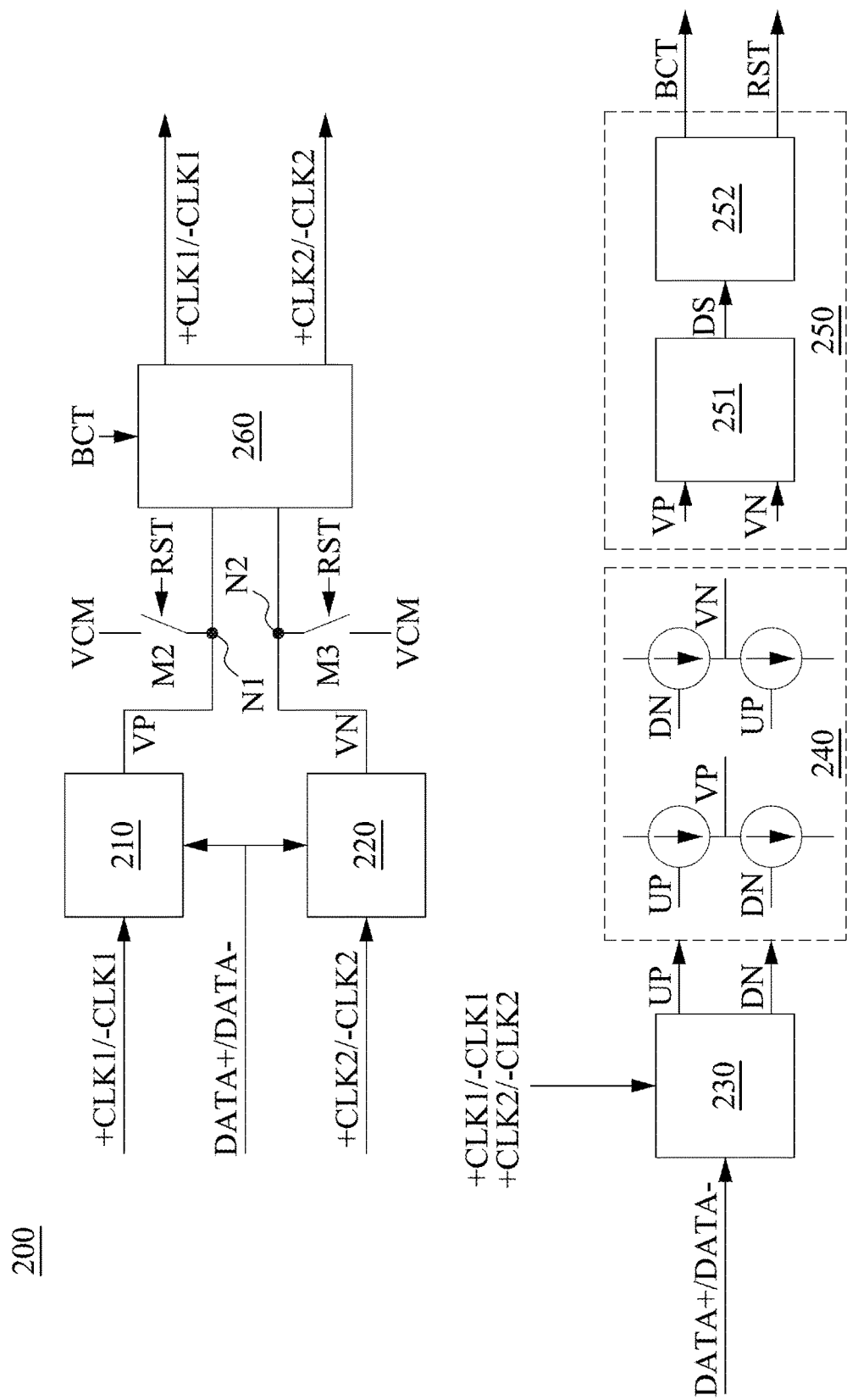
FIG. 2 is a schematic diagram of a clock and data recovery circuit according to some embodiments of the present disclosure.

Reference is made to FIG. 2. FIG. 2 is a schematic diagram of a clock and data recovery circuit 200 according to some embodiments of the present disclosure. As illustrated in FIG. 2, the clock and data recovery circuit 200 includes a sampling phase detector and filter circuitry 210, a sampling phase detector and filter circuitry 220, a frequency detector circuit 230, a current source circuit 240, a band controller circuit 250, a voltage controlled oscillator 260, and switches M2-M3.

In operation, the sampling phase detector and filter circuitry 210 is configured to receive the pair of data DATA+ and DATA− and the first set of clock signals +CLK1 and −CLK1, to generate the first voltage VP according to the pair of data DATA+ and DATA− and the first set of clock signals +CLK1 and −CLK1. The sampling phase detector and filter circuitry 220 is configured to receive the pair of data DATA+ and DATA− and the second set of clock signals +CLK2 and −CLK2, to generate the second voltage VN according to the pair of data DATA+ and DATA− and the second set of clock signals +CLK2 and −CLK2.

The sampling phase detector and filter circuitry 210, the switch M2, and a first input terminal of the voltage controlled oscillator 260 are coupled at a node N1. The sampling phase detector and filter circuitry 220, the switch M3, and a second input terminal of the voltage controlled oscillator 260 are coupled at a node N2. The voltage controlled oscillator 260 is configured to generate the first set of clock signals +CLK1 and −CLK1 and the second set of clock signals +CLK2 and −CLK2 according to the first voltage VP and the second voltage VN.

The frequency detector circuit 230 is coupled to the voltage controlled oscillator 260 and configured to receive the pair of data DATA+ and DATA−, the first set of clock signals +CLK1 and −CLK1 and the second set of clock signals +CLK2 and −CLK2, to generate the up control signal UP and the down control signal DN according to these signals. The current source circuit 240 includes two power source strings. One of the power source strings is configured to generate the first voltage VP according to the up control signal UP and the down control signal DN, and the other of the power source strings is configured to generate the second voltage VN according to the up control signal UP and the down control signal DN.

The band controller circuit 250 includes a driver circuit 251 and a driver circuit 252. The driver circuit 251 is configured to generate a driving signal DS according to the first voltage VP and the second voltage VN. The driver circuit 252 is configured to generate the band control signal BCT and the reset signal RST according to the driving signal DS. The band control signal BCT is configured to adjust the band of the voltage controlled oscillator 260.

The reset signal RST is configured to reset the voltage controlled oscillator 260. For example, the switches M2-M3 are configured to receive the reset voltage VCM and the switches M2-M3 are controlled to be turned on or off by the reset signal RST. For example, when the switches M2-M3 are controlled to be turned on by the reset signal RST, the switches M2-M3 transmit the reset voltage VCM to the voltage controlled oscillator 260, such that the voltage controlled oscillator 260 is reset to an initial value according to the reset voltage VCM.

Figure 3:
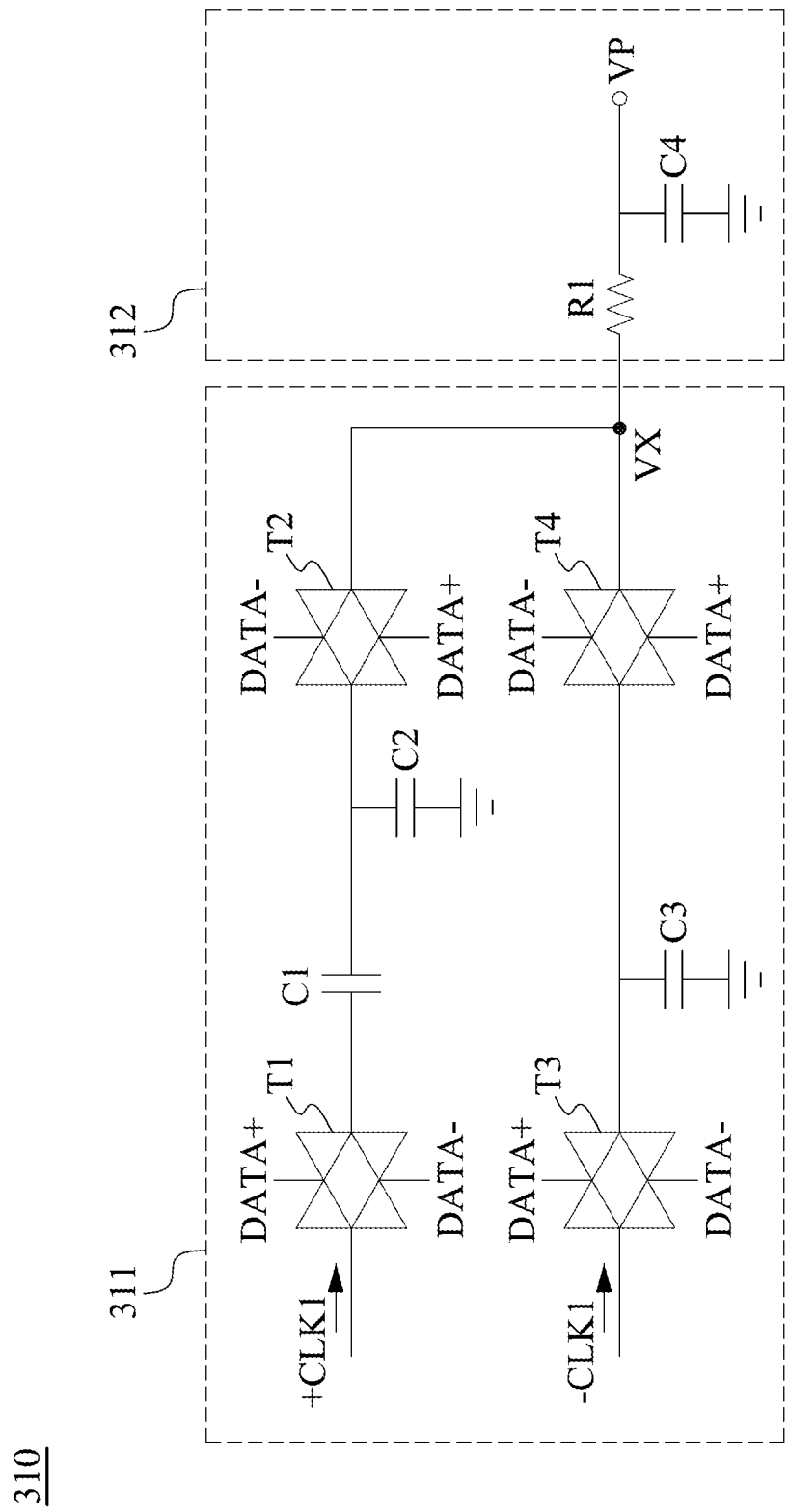
FIG. 3 is a schematic diagram of a sampling phase detector and filter circuitry according to some embodiments of the present disclosure.

Reference is made to FIG. 3. FIG. 3 is a schematic diagram of a sampling phase detector and filter circuitry 310 according to some embodiments of the present disclosure. In some embodiments, the sampling phase detector and filter circuitry 310 is configured implement the sampling phase detector and filter circuitry 110 or the sampling phase detector and filter circuitry 120 in FIG. 1, or configured implement the sampling phase detector and filter circuitry 210 or the sampling phase detector and filter circuitry 220 in FIG. 2.

The following paragraphs take the sampling phase detector and filter circuitry 110 in FIG. 1 implemented by the sampling phase detector and filter circuitry 310 as an example for explanation, but the present disclosure is not limited thereto.

As illustrated in FIG. 3, the sampling phase detector and filter circuitry 310 includes a sampling phase detector circuit 311 and a filter circuit 312. The sampling phase detector circuit 311 is configured to generate the detection signal VX according to the pair of data DATA+ and DATA− and the first set of clock signals +CLK1 and −CLK1. The filter circuit 312 is configured to generate the first voltage VP according to the detection signal VX.

For example, the sampling phase detector circuit 311 includes transmission gates T1-T4 and capacitors C1-C3. The transmission gate T1 is configured to receive the clock signal +CLK1, and the transmission gate T3 is configured to receive the clock signal −CLK1. Each of transmission gates T1-T4 is configured to receive the pair of data DATA+ and DATA−. The capacitors C1-C2 are coupled between the transmission gate T1 and the transmission gate T2. The capacitor C3 is coupled between the transmission gate T3 and the transmission gate T4. The transmission gate T2 and the transmission gate T4 are directly coupled to the filter circuit 312. The filter circuit 312 includes a resistor R1 and a capacitor C4, to form a low-pass filter.

The implementation of the sampling phase detector and filter circuitry 310 above is only for illustration, and various implementations of the sampling phase detector and filter circuitry 310 are within the contemplated scopes of the present disclosure.

As described above, in the clock and data recovery circuit of the present disclosure, there is no need to dispose a charge pump between the sampling phase detector circuit and the filter circuit. Accordingly, the structure of the clock and data recovery circuit of the present disclosure is simpler.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A clock and data recovery circuit, comprising:
   a first sampling phase detector and filter circuitry configured to generate a first voltage according to a pair of data and a first set of clock signals;
   a second sampling phase detector and filter circuitry configured to generate a second voltage according to the pair of data and a second set of clock signals,
   a frequency detector circuit configured to generate an up control signal and a down control signal according to the pair of data, the first set of clock signals, and the second set of clock signals;
   a current source circuit configured to generate the first voltage and the second voltage according to the up control signal and the down control signal;
   a band controller circuit configured to generate a band control signal according to the first voltage and the second voltage; and
   a voltage controlled oscillator configured to adjust the first set of clock signals and the second set of clock signals according to the band control signal, the first voltage, and the second voltage.

2. The clock and data recovery circuit of claim 1, wherein first sampling phase detector and filter circuitry comprises:
   a first sampling phase detector circuit configured to generate a first detection signal according to the pair of data and the first set of clock signals; and
   a first filter circuit configured to generate the first voltage according to the first detection signal.

3. The clock and data recovery circuit of claim 2, wherein the first filter circuit is directly coupled to the first sampling phase detector circuit.

4. The clock and data recovery circuit of claim 2, wherein the first filter circuit is directly coupled to the voltage controlled oscillator.

5. The clock and data recovery circuit of claim 2, wherein second sampling phase detector and filter circuitry comprises:
   a second sampling phase detector circuit configured to generate a second detection signal according to the pair of data and the second set of clock signals; and
   a second filter circuit configured to generate the second voltage according to the second detection signal.

6. The clock and data recovery circuit of claim 5, wherein the second filter circuit is directly coupled to the second sampling phase detector circuit.

7. The clock and data recovery circuit of claim 5, wherein the second filter circuit is directly coupled to the voltage controlled oscillator.

8. The clock and data recovery circuit of claim 5, wherein the band controller circuit comprises:
   a driver circuit configured to generate a driving signal according to the first voltage and the second voltage; and
   a controller configured to generate the band control signal and a reset signal according to the driving signal, wherein the reset signal is configured to reset the voltage controlled oscillator.

9. The clock and data recovery circuit of claim 5, wherein the first sampling phase detector circuit or the second sampling phase detector circuit comprises:
   a first transmission gate;
   a second transmission gate, wherein a first capacitor and a second capacitor are coupled between the first transmission gate and the second transmission gate;
   a third transmission gate; and
   a fourth transmission gate, wherein a third capacitor is coupled between the third transmission gate and the fourth transmission gate, wherein the second transmission gate and the fourth transmission gate are directly coupled to the first filter circuit or the second filter circuit.

10. The clock and data recovery circuit of claim 9, wherein the first filter circuit or the second filter circuit comprises a resistor and a fourth capacitor, to form a low-pass filter.

* * * * *